US008571084B2

(12) United States Patent  
Docter et al.

(10) Patent No.: US 8,571,084 B2  
(45) Date of Patent: Oct. 29, 2013

(54) SEMICONDUCTOR LASER DEVICE

(75) Inventors: Boudewijn Docter, Eindhoven (NL); Stefano Beri, Imperia (IT); Meint Koert Smit, Best (NL); Fouad Karouta, Canberra (AU); Xaverius Jacques Maria Leijtens, Eindhoven (NL)

(73) Assignee: Technische Universiteit Eindhoven, Eindhoven (NL)

( * ) Notice: Subject to any disclaimer, the term of this patent is extended or adjusted under 35 U.S.C. 154(b) by 135 days.

(21) Appl. No.: 12/671,550

(22) PCT Filed: Aug. 1, 2008

(86) PCT No.: PCT/NL2008/000185  
§ 371 (c)(1), (2), (4) Date: Jul. 20, 2010

(87) PCT Pub. No.: WO2009/017398  
PCT Pub. Date: Feb. 5, 2009

(65) Prior Publication Data  
US 2011/0216789 A1 Sep. 8, 2011

Related U.S. Application Data

(60) Provisional application No. 60/962,990, filed on Aug. 2, 2007.

(51) Int. Cl.  
*H01S 5/0625* (2006.01)  
*H01S 5/40* (2006.01)  
*H01S 3/082* (2006.01)

(52) U.S. Cl.  
USPC ............ 372/97; 372/20; 372/23; 372/50.121; 372/50.122

(58) Field of Classification Search  
USPC .............. 372/20, 23, 50.121, 50.122, 97  
See application file for complete search history.

(56) References Cited

U.S. PATENT DOCUMENTS 5,881,079 A * 3/1999 Doerr et al. ............... 372/20  
7,139,455 B1 * 11/2006 Gunn et al. ............... 385/37  
(Continued)

FOREIGN PATENT DOCUMENTS

EP 0762573 3/1997  
EP 0883216 12/1998  
(Continued)

OTHER PUBLICATIONS

W.T Tsang et al.; "High-speed direct single-frequency modulation with large tuning rate and frequency excursion in cleaved-coupled-cavity semiconductor lasers", Applied Physics Letters, AIP, American Institute of Physics, Melville, NY vol. 42, No. 8, pp. 650-652, Apr. 15, 1983.  
International Search Report of PCT/NL2008/000185 dated Nov. 14, 2008.

*Primary Examiner* — Jessica Stultz  
*Assistant Examiner* — Michael Carter  
(74) *Attorney, Agent, or Firm* — Lumen Patent Firm

(57) ABSTRACT

The present invention is directed to a semiconductor laser device comprising a first resonator section for resonating an optical resonator signal for providing an optical output signal at an output of said laser device, wherein said first resonator section is arranged for selectively resonating at a plurality of discrete output wavelengths, and wherein said laser device further comprises a second resonator section operatively connected to said first resonator section, said second resonator section being arranged for providing an optical feedback signal at a feedback wavelength to said first resonator section for locking said first resonator section into resonating at a selected output wavelength of said discrete output wavelengths, which selected output wavelength corresponds to said feedback wavelength for providing said optical output signal.

14 Claims, 10 Drawing Sheets

(56) References Cited

U.S. PATENT DOCUMENTS

| | | |
|---|---|---|
| 2002/0105990 A1* | 8/2002 | Fish et al. ................ 372/50 |
| 2002/0118711 A1 | 8/2002 | Jacquet |
| 2003/0112843 A1 | 6/2003 | Thornton et al. |
| 2004/0190565 A1* | 9/2004 | Thourhout ................ 372/20 |
| 2005/0135449 A1* | 6/2005 | Sorin et al. ................ 372/50 |
| 2005/0249256 A1* | 11/2005 | He ................ 372/50.1 |

FOREIGN PATENT DOCUMENTS

| | | |
|---|---|---|
| GB | 2448162 | 10/2008 |
| JP | 3-274784 | 12/1991 |
| WO | 03012936 | 2/2003 |

\* cited by examiner

SEMICONDUCTOR LASER DEVICE

FIELD OF THE INVENTION

The present invention is directed to a semiconductor laser device comprising a first resonator section for resonating an optical resonator signal for providing an optical output signal at an output of said laser device.

BACKGROUND OF THE INVENTION

Semiconductor laser devices as described above are generally known and widely used in many applications in a variety of industries, such as for example telecommunications industry.

Today's trend in optical communications is towards extending the optical fiber network to the end user (private or business) in order to provide a broad range of services, such as telephone, television and broadband internet. Therefore, the largest growth figures in optical communication networks are expected in the access network, where large numbers of local users get direct or wireless access to the optical network. Such effort to provide local users with direct optical access is known in jargon as Fiber To The Premises (FTTP) or Fiber To The Home (FTTH).

For large-scale application in telecommunication access networks light sources have to be simple, robust and low-cost. FTTH/FTTP requires a large volume of optical sources and therefore it will open a worldwide market for low-cost tunable lasers. A successful device for FTTH applications is a cheap, easy-tunable laser which operates in a small number of channels (4-8 wavelengths). In a larger area network such as a metropolitan or regional network, a successful device requires a higher performance operation in a larger number of channels (16-32 wavelengths).

Today's tunable sources usually consist of an optical laser cavity that can resonate at a large number of wavelengths. Two or three tunable elements inside the cavity are used for selecting the right wavelength out of a multitude. The relation between wavelength and control currents is complicated, and a complex control algorithm is needed for getting stable operation at the right wavelength. To provide the algorithm with the proper control data an extensive and expensive characterization of each laser is necessary.

It is an object of the present invention to provide a low-cost, robust light source, usable in a variety of optical communications solutions within the telecommunications industry.

It is a further object to overcome the abovementioned disadvantages and problems encountered with prior art light sources.

The invention thereto provides a semiconductor laser device comprising a first resonator section for resonating an optical resonator signal for providing an optical output signal at an output of said laser device, wherein said first resonator section is arranged for selectively resonating at a plurality of discrete output wavelengths, and wherein said laser device further comprises a second resonator section operatively connected to said first resonator section, said second resonator section being arranged for providing an optical feedback signal at a feedback wavelength to said first resonator section for locking said first resonator section into resonating at a selected output wavelength of said discrete output wavelengths, which selected output wavelength corresponds to said feedback wavelength for providing said optical output signal.

Proposed is a tuning approach in which a laser is used that can operate only at a discrete set of equally spaced wavelengths that are matched to the internationally standardized telecommunication wavelengths (ITU-grid). The desired wavelength is selected by re-injecting a small signal at the right wavelength into the laser (filtered feedback). For this purpose a compact active discretely tunable filter (Arrayed waveguide grating (AWG)) is used. This approach yields a better stability and a simpler tuning algorithm than the schemes that are presently applied.

For the wavelength-stabilization scheme the concept of Filtered Optical Feedback (FOF) may be applied, in combination with mathematical discoveries in the field of Delayed Differential Equations (DDE). As a control scheme, filtered feedback performs better than prior art solutions.

The laser and the feedback filter may be integrated in a small chip (<1 mm$^2$) that can address a moderate number of wavelengths (8 or 16). This will provide a low-cost solution for large scale application in user access networks. For application in higher level networks more wavelengths are needed. The number of wavelengths of the chip may in accordance with an embodiment be extended by including a tunable Bragg reflector in the active filter, which enables to increase the total number of wavelengths with a factor of 2-4.

The description and claims at various locations make use of the wording 'discrete wavelengths'. This is to be interpreted in line with the normal physical meaning thereof, i.e. not only comprising the exact wavelengths but rather comprising the mentioned wavelength and a narrow range around that wavelength, dependent on the characteristics of the elements to which the terminology applies.

Preferred and alternative embodiments are described in the dependent claims of the application.

DETAILED DESCRIPTION

Introduction

Figure 1:
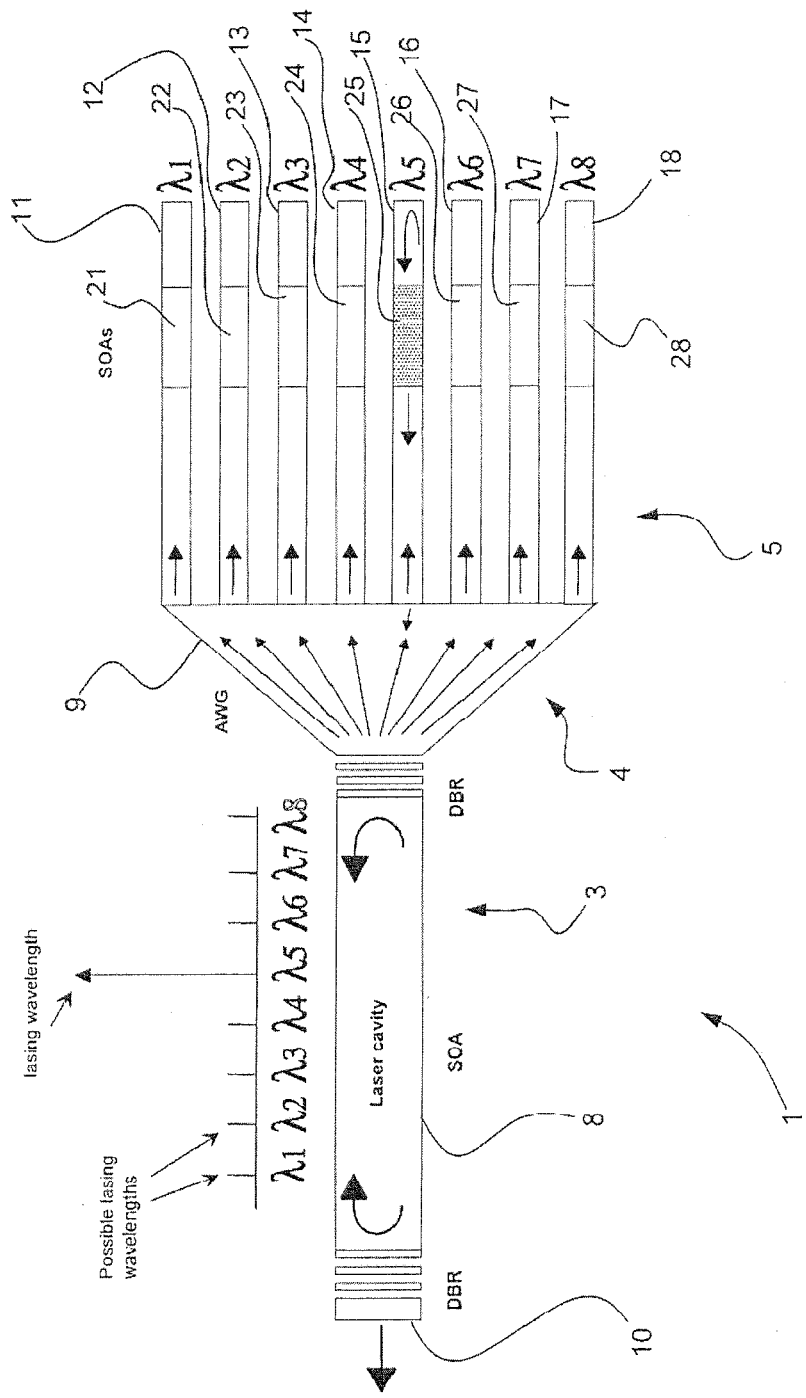
FIG. 1 illustrates a semiconductor laser device in accordance with the present invention.

The invention provides a cheap stable integrated tunable laser, which allows the selective emission of a set of different optical wavelengths which are spaced according to the ITU grid specifications. This is an international standard for optical telecommunication frequencies. A Distributed Bragg Reflector laser (DBR-Laser) is employed in combination with an Arrayed Waveguide Grating (AWG), integrated with a set of semiconductor optical amplifiers (see FIG. 1).

In this design, properties of the distributed Bragg reflector (DBR) mirrors are used that were previously unexploited. Distributed Bragg reflector (DBR) mirrors can be designed to provide wavelength-dependent reflectivity, with either a wide or narrow reflection bandwidth. Opposite to the standard design that focuses on achieving single mode operation through a narrow reflection bandwidth, we propose short distributed Bragg reflector (DBR) sections with wide bandwidths, which allow laser operation in several different modes. The Arrayed waveguide grating (AWG) is introduced in this design as a tunable filter, which allows one to select and stabilize the operation of the laser in one of the frequency modes through filtered feedback. At the same time the Arrayed waveguide grating (AWG) will suppress the emission of the undesired wavelengths.

In order to produce a device which will fit the international standards for telecommunications and will be suitable for FTTH/FTTP purposes, the length of the laser cavity (approximately 500 µm) and the bandwidth of the distributed Bragg reflector (DBR) mirrors (approximately 200 nm) is such that the distributed Bragg reflector (DBR) laser can operate in at least 8 modes which are spaced at the ITU grid. The channel spacing of the Arrayed waveguide grating (AWG) is designed in order to match the free spectral range of the distributed Bragg reflector (DBR) laser. It is important to notice that the FSR of the laser cavity does not necessarily have to be the same as the channel spacing of the Arrayed waveguide grating (AWG) (or any other filter realization). As long as the wavelengths in between the channels get suppressed more than the one that is passed through the filter the device will operate the same way. In this way, one can generate feedback at the ITU wavelengths produced by the laser. With this design, it is possible to selectively stabilize the device at the desired ITU wavelength via filtered optical feedback.

In modern optical communication networks, the extremely large bandwidth of optical fibers is exploited very effectively by Wavelength Division Multiplexing (WDM), i.e. different wavelengths (or channels) are used to carry different messages or different parts of the same message and travel together in the same fiber.

Large centers are connected via so-called backbone fibers that carry more than 40 multiplexed channels; in regional networks 8 to 40 channels are deployed, while local networks might require 4 to 8 channels. One of the most ambitious aims of modern communications are the so called Fiber-to-the-Home (FTTH) or Fiber-to-the-Premises (FTTP) projects, which ultimately consist in linking every household to an optical fiber. Such applications might work efficiently with 4-8 wavelengths.

The efforts towards a full penetration of optical networks towards the end users cause an increasing demand for laser sources. However, the specific requirements are different at each layer of the network. For the optical backbone, the main demand is for performance: narrow line width, many wavelengths and high power are the key issues. Moving to local levels, a lower performance is sufficient and the key parameter for a market-successful laser is the cost.

A very efficient use of available bandwidth would be a configuration of shared connections with packets of information being routed towards different users by wavelength-routing.

However, the use of single wavelength lasers for such purposes is not very cost effective, since this requires a network provider to keep a large amount of backup lasers in case one laser fails. Tunable lasers provide a good solution as a single tunable device is capable to produce a large number of relevant wavelengths, thus reducing the inventory costs. Moreover, a single device which can be rapidly tuned to different ITU wavelengths would be extremely relevant for a cost effective realization of packet-switching access networks.

Therefore, a successful tunable laser should score well in the following operational characteristics: output power, tunability i.e. the window of wavelengths that can be produced, switching-speed i.e. the minimum amount of time required to switch from operation in one channel to operation in another channel and wavelength-stability i.e. the device must operate only at the desired wavelength and operation in other channels should be suppressed.

Nowadays devices focus on wavelength windows around 1.55 µm (C-band). At these wavelengths, the channel spacing is of the order of 0.5-1 nm (50 or 100 GHz), which means that a tunability of 10 nm allows approximately 10-15 channels. The current design for tunable lasers is based on the idea of controlling a fully tunable device. Such a device is in principle capable to emit every possible wavelength in a certain window, and during operation, it requires to be stabilized to a well defined channel. However, this stabilization of the emission wavelength requires complicated (and expensive) control schemes.

Additionally, the speed of the device should be sufficient to allow wavelength switching between each transmitted data packet. This is essential for application in Passive Optical Networks (PONS) in which the routing of the packets is done by sending the data with the right wavelength. Static wavelength filters are then sufficient to perform the routing. To add maximum flexibility to the network, packet switching is essential in every layer of the network.

Wavelength Stability

Lack of wavelength-stability in semiconductor lasers is ultimately due to the fundamental quantum mechanical nature of the light-matter interaction. During the operation of any laser device, an unavoidable amount of spontaneous emission noise (SE-noise) is always present. Such noise consists in a random emission of photons in the laser cavity as a consequence of spontaneous recombination of carriers in the semiconductor material. The SE-Noise is responsible for mode-hopping i.e. the operation in one wavelength is suddenly suppressed, while the device starts emitting in a second undesired lasing mode. The resulting operation consists in alternate emission on different channels. From the telecommunications point of view, mode-hopping corresponds to the operation of the laser in an undesired channel and consequently a dramatic deterioration of the communication quality. Although spontaneous emission noise is present in every kind of laser, it is clear that the wavelength-stability of devices which are designed to operate at all possible wavelengths in a window will be affected more heavily, thus making their control extremely intricate. In the next section we introduce a new laser design which exploits the most modern results in filtered-optical feedback to simplify the stable operation of the laser in a set of communication-relevant wavelengths.

The Integrated Filtered-Feedback Tunable Laser (IFF-TL)

As opposed to a device that is capable of generating all possible wavelengths having a control scheme to tune the operation to the desired channel, the present invention focuses on a device which produces only a certain discrete set of wavelengths (for example matching the ITU grid specifications) and on the choice of filtered optical feedback (FOF)

as control scheme. A device operating only on a discrete set of wavelengths is intrinsically more stable compared to devices that can be continuously tuned.

Optical feedback supports the stabilization of laser devices. Part of the radiation emitted by the laser is re-injected in the system in such a way as to affect the semiconductor gain. Filtered feedback allows to independently address the gain of each wavelength, in practice offering the tool to suppress (by suppressing the gain) or enhance (by increasing the gain) the operation at certain wavelengths. This scheme is used in the present invention to select and stabilize the operation at a single relevant wavelength.

In FIG. 1 a schematic design for an 8-channel tunable device in accordance with the invention is shown. The same design principle can be applied to a different number of channels, but the 8-channel device is illustrated here as an example.

The device 1 consists of a first resonator section 3 comprising a relatively short distributed Bragg reflector (DBR)-Laser 8 (500 µm), coupled to a second resonator section 5 comprising a set of 8 independent cavities (11, 12, 13, 14, 15, 16, 17, 18) which contain short semiconductor optical amplifiers (SOAs), such as SOA 28, that can be independently biased. The first resonator section 3 and the second resonator section 5 are operatively connected through tunable filter 4 which is composed of an Arrayed waveguide grating (AWG) (300 µm×300 µm, in this embodiment). The distributed Bragg reflector (DBR)-Laser 8 is designed to generate a set of 8 different wavelengths $\lambda_1, \lambda_2, \ldots \lambda_8$, which are centred at $\lambda=1.550$ µm and are separated by a constant channel spacing $\Delta\lambda$. These wavelengths match a set of wavelengths specified in the ITU grid, which is specified in table 1. In fact, the generated wavelengths may be any wavelengths generated within the range of 1.400 µm and 1.600 µm, not necessarily centred around 1.550 µm, and advantageously (but not limited to) wavelengths selected from the ITU-grid specified in table 1.

The wavelengths may correspond to one or more elements from a group comprising 1490.76 nm, 1491.13 nm, 1491.50 nm, 1491.88 nm, 1492.25 nm, 1492.62 nm, 1492.99 nm, 1493.36 nm, 1493.73 nm, 1494.11 nm, 1494.48 nm, 1494.85 nm, 1495.22 nm, 1495.60 nm, 1495.97 nm, 1496.34 nm, 1496.72 nm, 1497.09 nm, 1497.46 nm, 1497.84 nm, 1498.21 nm, 1498.59 nm, 1498.96 nm, 1499.34 nm, 1499.71 nm, 1500.09 nm, 1500.46 nm, 1500.84 nm, 1501.21 nm, 1501.59 nm, 1501.97 nm, 1502.34 nm, 1502.72 nm, 1503.10 nm, 1503.47 nm, 1503.85 nm, 1504.23 nm, 1504.60 nm, 1504.98 nm, 1505.36 nm, 1505.74 nm, 1506.12 nm, 1506.49 nm, 1506.87 nm, 1507.25 nm, 1507.63 nm, 1508.01 nm, 1508.39 nm, 1508.77 nm, 1509.15 nm, 1509.53 nm, 1509.91 nm, 1510.29 nm, 1510.67 nm, 1511.05 nm, 1511.43 nm, 1511.81 nm, 1512.19 nm, 1512.58 nm, 1512.96 nm, 1513.34 nm, 1513.72 nm, 1514.10 nm, 1514.49 nm, 1514.87 nm, 1515.25 nm, 1515.63 nm, 1516.02 nm, 1516.40 nm, 1516.78 nm, 1517.17 nm, 1517.55 nm, 1517.94 nm, 1518.32 nm, 1518.71 nm, 1519.09 nm, 1519.48 nm, 1519.86 nm, 1520.25 nm, 1520.63 nm, 1521.02 nm, 1521.40 nm, 1521.79 nm, 1522.18 nm, 1522.56 nm, 1522.95 nm, 1523.34 nm, 1523.72 nm, 1524.11 nm, 1524.50 nm, 1524.89 nm, 1525.27 nm, 1525.66 nm, 1526.05 nm, 1526.44 nm, 1526.83 nm, 1527.22 nm, 1527.60 nm, 1527.99 nm, 1528.38 nm, 1528.77 nm, 1529.16 nm, 1529.55 nm, 1529.94 nm, 1530.33 nm, 1530.72 nm, 1531.12 nm, 1531.51 nm, 1531.90 nm, 1532.29 nm, 1532.68 nm, 1533.07 nm, 1533.47 nm, 1533.86 nm, 1534.25 nm, 1534.64 nm, 1535.04 nm, 1535.43 nm, 1535.82 nm, 1536.22 nm, 1536.61 nm, 1537.00 nm, 1537.40 nm, 1537.79 nm, 1538.19 nm, 1538.58 nm, 1538.98 nm, 1539.37 nm, 1539.77 nm, 1540.16 nm, 1540.56 nm, 1540.95 nm, 1541.35 nm, 1541.75 nm, 1542.14 nm, 1542.54 nm, 1542.94 nm, 1543.33 nm, 1543.73 nm, 1544.13 nm, 1544.53 nm, 1544.92 nm, 1545.32 nm, 1545.72 nm, 1546.12 nm, 1546.52 nm, 1546.92 nm, 1547.32 nm, 1547.72 nm, 1548.11 nm, 1548.51 nm, 1548.91 nm, 1549.32 nm, 1549.72 nm, 1550.12 nm, 1550.52 nm, 1550.92 nm, 1551.32 nm, 1551.72 nm, 1552.12 nm, 1552.52 nm, 1552.93 nm, 1553.33 nm, 1553.73 nm, 1554.13 nm, 1554.54 nm, 1554.94 nm, 1555.34 nm, 1555.75 nm, 1556.15 nm, 1556.55 nm, 1556.96 nm, 1557.36 nm, 1557.77 nm, 1558.17 nm, 1558.58 nm, 1558.98 nm, 1559.39 nm, 1559.79 nm, 1560.20 nm, 1560.61 nm, 1561.01 nm, 1561.42 nm, 1561.83 nm, 1562.23 nm, 1562.64 nm, 1563.05 nm, 1563.45 nm, 1563.86 nm, 1564.27 nm, 1564.68 nm, 1565.09 nm, 1565.50 nm, 1565.90 nm, 1566.31 nm, 1566.72 nm, 1567.13 nm, 1567.54 nm, 1567.95 nm, 1568.36 nm, 1568.77 nm, 1569.18 nm, 1569.59 nm, 1570.01 nm, 1570.42 nm, 1570.83 nm, 1571.24 nm, 1571.65 nm, 1572.06 nm, 1572.48 nm, 1572.89 nm, 1573.30 nm, 1573.71 nm, 1574.13 nm, 1574.54 nm, 1574.95 nm, 1575.37 nm, 1575.78 nm, 1576.20 nm, 1576.61 nm, 1577.03 nm, 1577.44 nm, 1577.86 nm, 1578.27 nm, 1578.69 nm, 1579.10 nm, 1579.52 nm, 1579.93 nm, 1580.35 nm, 1580.77 nm, 1581.18 nm, 1581.60 nm, 1582.02 nm, 1582.44 nm, 1582.85 nm, 1583.27 nm, 1583.69 nm, 1584.11 nm, 1584.53 nm, 1584.95 nm, 1585.36 nm, 1585.78 nm, 1586.20 nm, 1586.62 nm, 1587.04 nm, 1587.46 nm, 1587.88 nm, 1588.30 nm, 1588.73 nm, 1589.15 nm, 1589.57 nm, 1589.99 nm, 1590.41 nm, 1590.83 nm, 1591.26 nm, 1591.68 nm, 1592.10 nm, 1592.52 nm, 1592.95 nm, 1593.37 nm, 1593.79 nm, 1594.22 nm, 1594.64 nm, 1595.06 nm, 1595.49 nm, 1595.91 nm, 1596.34 nm, 1596.76 nm, 1597.19 nm, 1597.62 nm, 1598.04 nm, 1598.47 nm, 1598.89 nm, 1599.32 nm, 1599.75 nm, 1600.17 nm, 1600.60 nm, 1601.03 nm, 1601.46 nm, 1601.88 nm, 1602.31 nm, 1602.74 nm, 1603.17 nm, 1603.60 nm, 1604.03 nm, 1604.46 nm, 1604.88 nm, 1605.31 nm, 1605.74 nm, 1606.17 nm, 1606.60 nm, 1607.04 nm, 1607.47 nm, 1607.90 nm, 1608.33 nm, 1608.76 nm, 1609.19 nm, 1609.62 nm, 1610.06 nm, 1610.49 nm, 1610.92 nm, 1611.35 nm, 1611.79 nm, 1612.22 nm, 1612.65 nm, 1613.09 nm, 1613.52 nm, 1613.96 nm, 1614.39 nm, 1614.83 nm, 1615.26 nm, 1615.70 nm, 1616.13 nm, 1616.57 nm, 1617.00 nm, 1617.44 nm, 1617.88 nm, 1618.31 nm, 1618.75 nm, 1619.19 nm, 1619.62 nm, 1620.06 nm, 1620.50 nm, 1620.94 nm, 1621.38 nm, 1621.81 nm, and 1622.25 nm.

The Arrayed waveguide grating (AWG) 9 is designed in order to route each of the 8 wavelengths into different cavities (11, . . . , 18). In this way, each spectral component travels through a different SOA and can be independently manipulated. Finally, the filtered radiation is reflected back into the distributed Bragg reflector (DBR)-Laser cavity 8 by means of mirrors. The output radiation is collected at the output side 10 of the distributed Bragg reflector (DBR)-Laser 8.

With this design, one can directly control the level of feedback into the device of each of the wavelength components by controlling the SOA's 21, 22, 23, 24, 25, 26, 27 and 28. For stabilization purposes, only the SOA contact 25 corresponding to the relevant wavelength $\lambda 5$ is biased to provide amplification, whilst the other SOAs 21, 22, 23, 24, 25, 26, 27 and 28 are unbiased and therefore the other wavelengths are absorbed. This induces a decrease of losses (or enhancement of the gain) for one specific wavelength, which will perform stable laser operation, whilst other wavelengths will be suppressed. It is experimentally observed that feedback power fractions in the order of $10^{-5}$ are sufficient to stabilize a laser. This allows using very short SOA sections, which will operate at low injection current levels.

The total emitted power is determined mainly by the length of the main laser cavity 8. If a higher output power is required, it is expected that the cavity length could be doubled, tripled or even quadrupled, without much loss in stability, as long as every n-th mode matches with one of the channels of Arrayed waveguide grating (AWG) 9.

Figure 2:
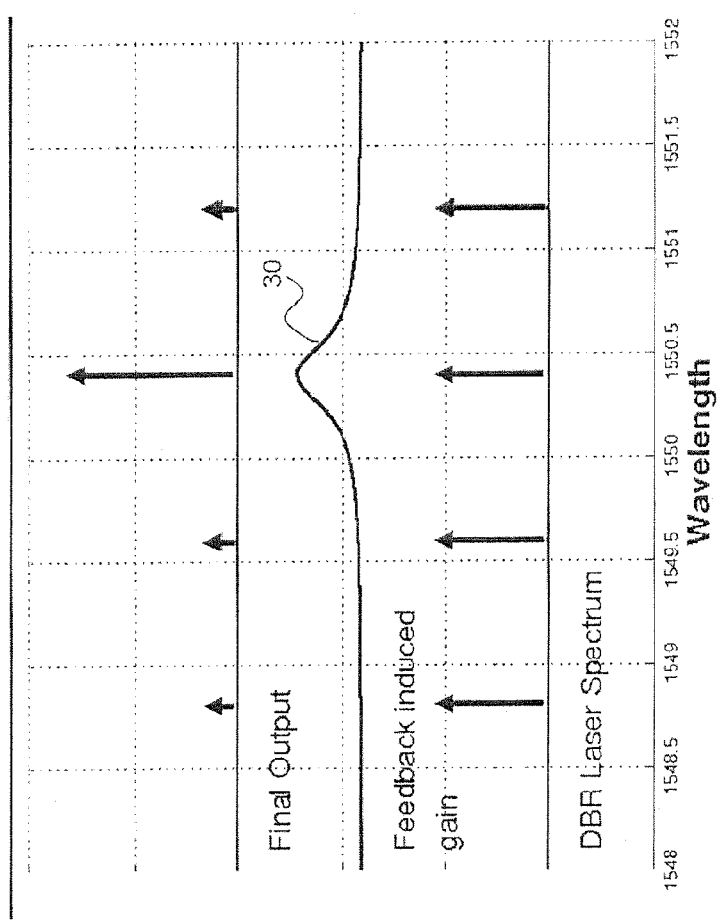
FIG. 2 schematically illustrates a mode selection principle for operating the semiconductor laser device illustrated in FIG. 1.

FIG. 2, illustrates how the operation of the device by the different SOAs may be controlled. As a stand-alone device, the distributed Bragg reflector (DBR)-laser 8 supports several longitudinal modes and its spectrum consists of multiple spectral lines at different wavelengths. By biasing a single SOA 25 in the feedback resonator section, one introduces a feedback induced gain which shows a peak 30 at the wavelength λ5 corresponding to that SOA. As a result the device 1 stably operates at the chosen wavelength.

Figure 3A:
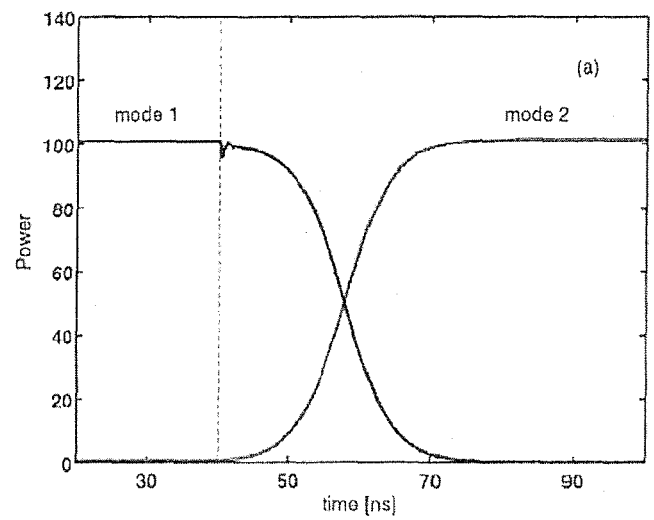
FIGS. 3A and 3B illustrate simulated switching characteristics of the device illustrated in FIG. 1.
Figure 3B:
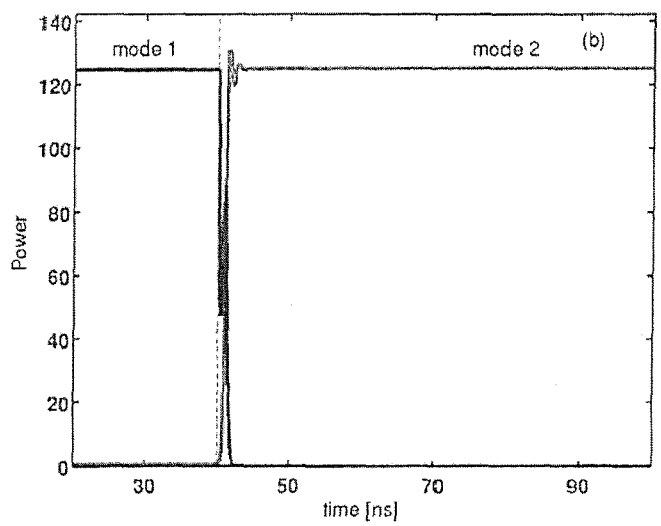

The operation-principle was tested by numerically simulating a multimode laser. The presence of feedback in one mode was modeled as an enhancement of the effective modal gain. An example of the result of such simulations for two different feedback regimes is shown in FIGS. 3A and 3B. When a SOA is biased in order to provide feedback, the corresponding mode (mode 1 in FIGS. 3A and 3B) will stably lase. If the feedback is moved to another channel (for example by biasing the SOA corresponding to mode 2), the operation of the system will settle to the second mode. The feedback-strength regulates the switching-time between the two modes. FIG. 3A illustrates the switching characteristics in the low-feedback regime, and FIG. 3B illustrates the switching characteristics in the high feedback-regime. The switching time can be pushed below 1 nanosecond (see FIG. 3B) at high feedback. The presence of the SOAs in the feedback arms will allow us to directly control the feedback-strength and to reduce the switching time to values suitable for packet-switching applications.

It is important to notice that this design does not require a high performance Arrayed waveguide grating (AWG), because the device needs only a small amount of feedback power. This will allow one to use a very small Arrayed waveguide grating (AWG) device.

It is noted that the mode-switch was induced by exploiting the natural dynamics of the system, thus no complicated methods were required to produce the mode-hop. A further advantage of the present approach is that during the wavelength switch no power will be generated in non-intended channels.

The choice of filtered feedback as a control scheme is a good alternative for achieving a simple and stable tunable device. Moreover, a feedback induced stabilization scheme makes the device less vulnerable to the effects of undesired external feedback (such as the feedback from an optical fiber tip). The wavelength control of the IFF-TL involves the tuning of only one electrode, making it very easy to operate. Moreover, there is a large tolerance on the control currents. The device is very efficient and does not require an external SOA in order to increase the output power. This results in a high degree of spectral purity of the signal, and in a small design in comparison with prior art solutions. Moreover, because the channels are defined by the Arrayed waveguide grating (AWG), the design in accordance with the invention is less prone to fabrication uncertainties, in comparison with existing solutions. The device can be integrated in complex optical circuits.

With an Arrayed waveguide grating (AWG) of 300 μm×300 μm area, a distributed Bragg reflector (DBR) cavity of 500 μm length and a set of 8 short SOAs of 20 μm length, the final size of the cleaved IFF-TL device will be comparable with or smaller than the size of the existing integrated tunable lasers.

The semiconductor laser device according to an embodiment of the invention may further comprise means for controlling a phase of said optical feedback signal.

Alternative Embodiments with Increased Number of Wavelengths

The current IFF-TL device is mainly aimed at access (FTTH) networks. For these networks, low-cost and simple, stable operation are the most important requirements. However, the device concept might also be exploited for higher network layers, for example in metro-area networks or even in backbone networks. In these parts of the network low-cost is not such a strict requirement, but the number of wavelengths addressable with the device must be extended.

Figure 4:
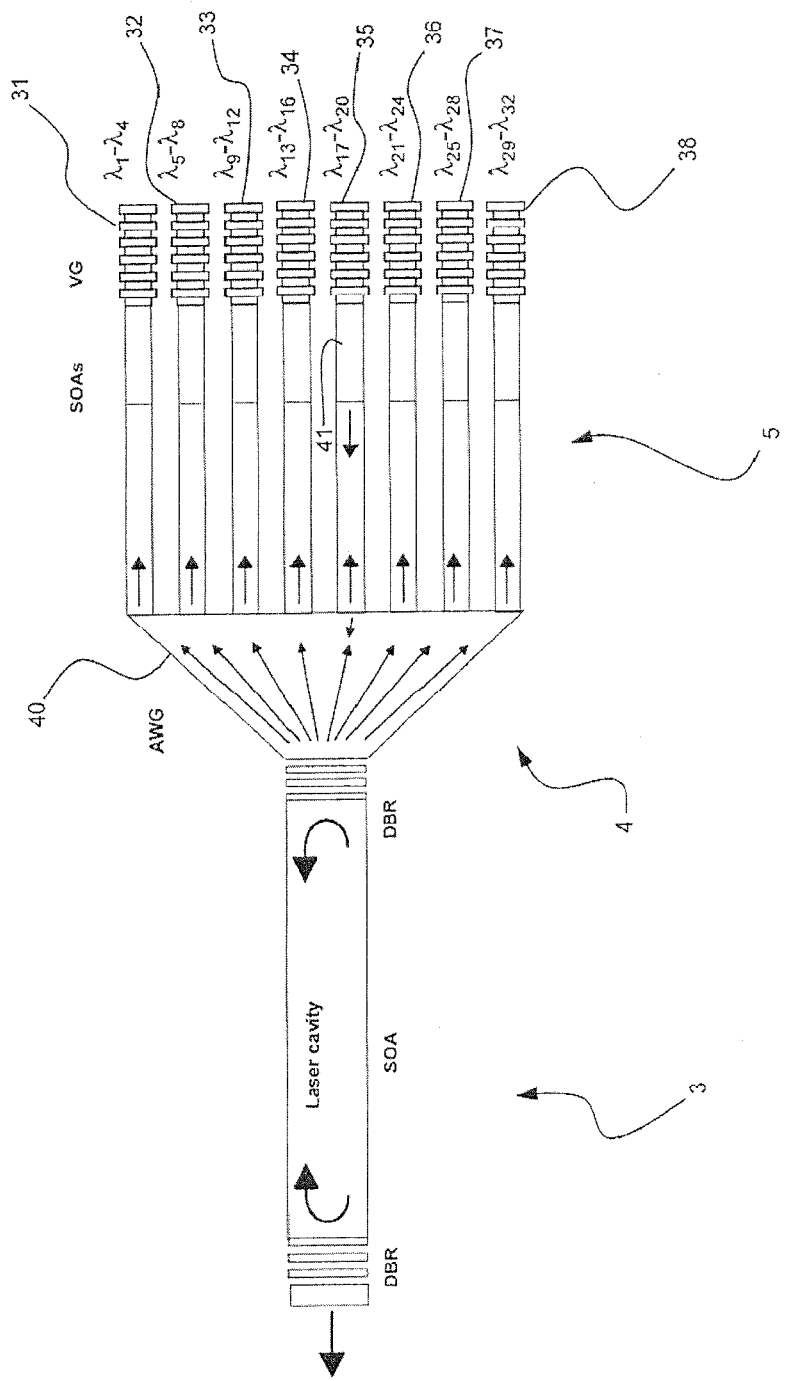
FIG. 4 shows an alternative embodiment of the present invention.
Figure 5:
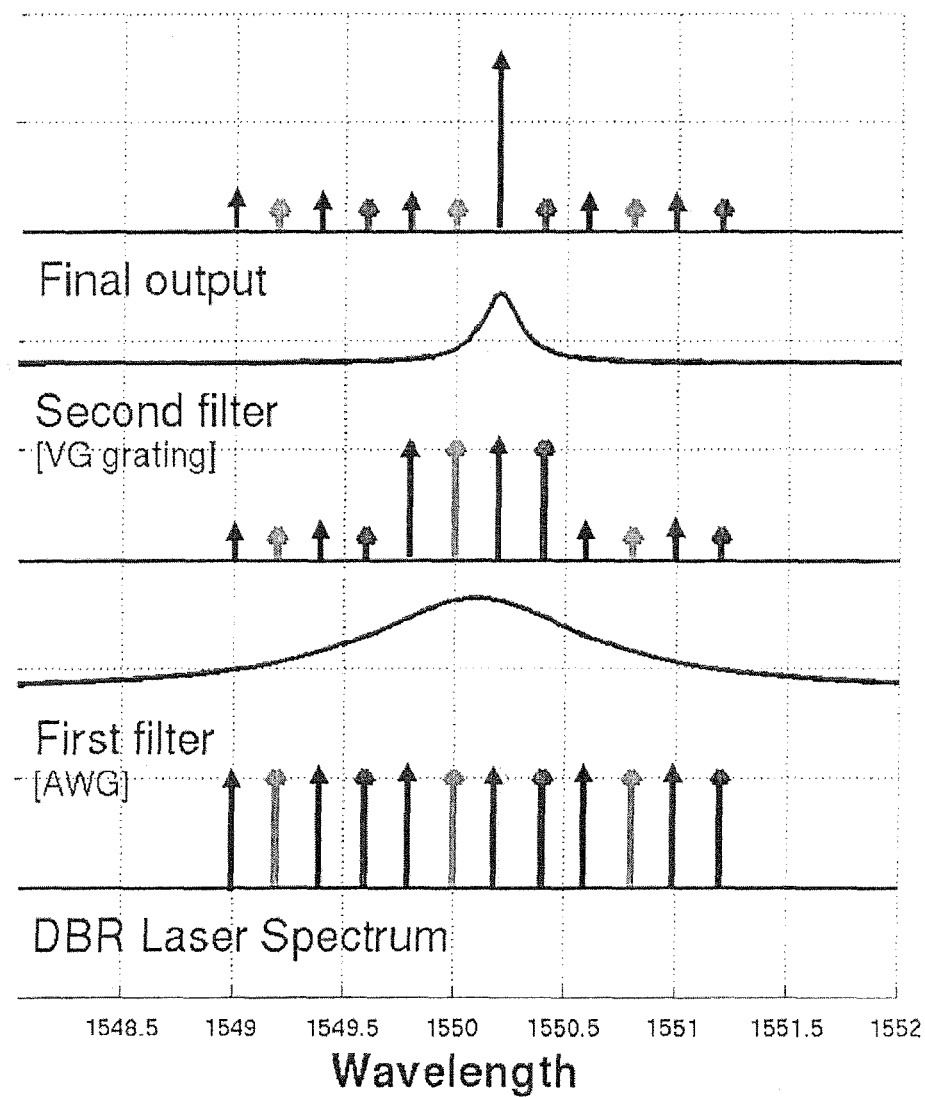
FIG. 5 schematically illustrates a mode selection principle for operating the semiconductor laser device illustrated in FIG. 4.

One possibility to increase the number of wavelengths in the device consists in increasing the number of channels of the Arrayed waveguide grating (AWG). However, this solution will make the device much larger. Another possibility of extending the number of wavelengths is shown in FIG. 4. In this design the reflectors 31, 32, 33, 34, 35, 36, 37 and 38 at the end of the external cavities in the feedback section 5 consist of tunable gratings, such as Vertical Groove (VG) gratings or surface gratings (both known to the skilled person). These VG gratings are wavelength-dependent reflectors that can be tuned by injecting current into the grating section. The idea is to design the Arrayed waveguide grating (AWG) 40 such that a set of wavelengths will end up in one of the external cavities, this is illustrated in the operating principle shown schematically in FIG. 5. The vertical groove grating is then designed in order to reflect only one selected feedback wavelength of these wavelengths back into the laser cavity (second filter in FIG. 5). The Semiconductor optical amplifier (SOA) 41 in the external cavity still operates as an optical gate, but can also be used to compensate for possible differences in transmission loss of the Arrayed waveguide grating (AWG) 40 for the different wavelengths.

Figure 6:
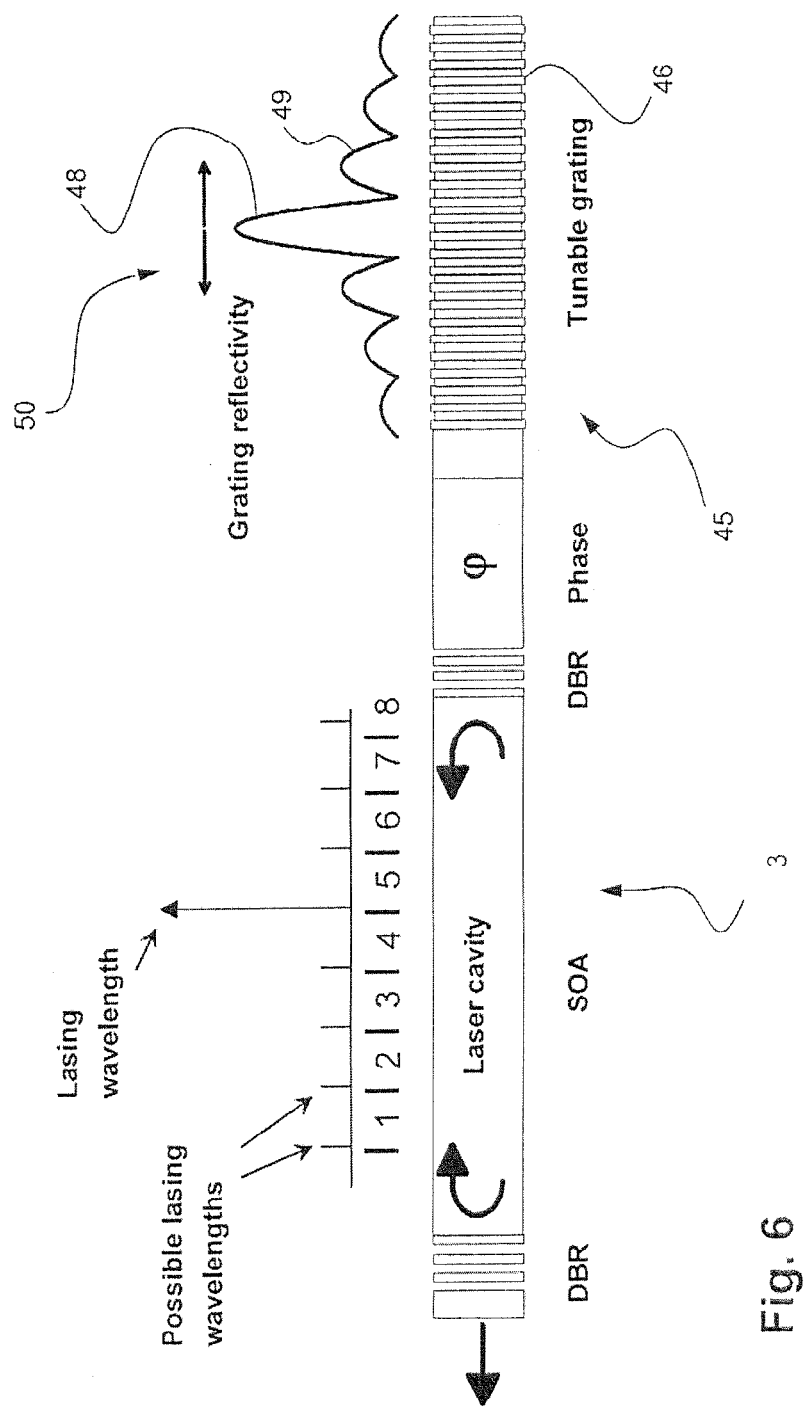
FIG. 6 illustrates an alternative embodiment of the invention based on a tunable grating in the feedback section.
Figure 7:
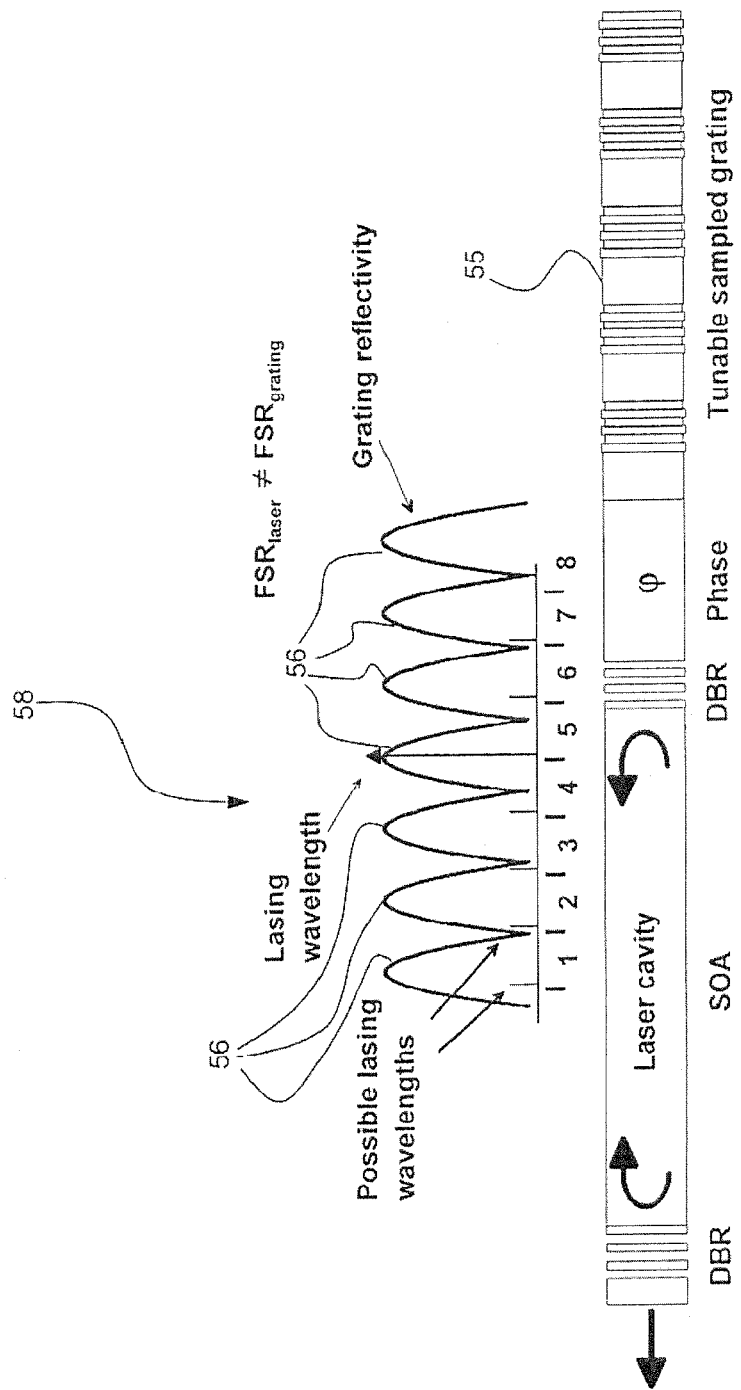
FIG. 7 illustrates an alternative embodiment of the invention based on a sampled tunable grating applied in the feedback section.

Further alternative embodiments of the device in accordance with the invention are illustrated in FIG. 6 and FIG. 7. The embodiment in FIG. 6 comprises a feedback section 45 which is based on a tunable grating 46. The grating reflectivity 50 shown above the tunable grating 46 in FIG. 6 reveals a number of secondary maxima 49 in reflectivity around a primary maximum 49, making the tunable grating 46 suitable for use in the feedback resonator section 45 of a device in accordance with the present invention. First resonator section 3 is similar to the first resonator section in FIG. 1.

The embodiment shown in FIG. 7 makes use of a tunable sampled grating 55. This embodiment has the additional benefit that maxima 56 in the grating reflectivity 58 are of a same magnitude. Therefore a Vernier effect can be used to cover a wide wavelength range.

Multiple Output Cavities

Figure 8:
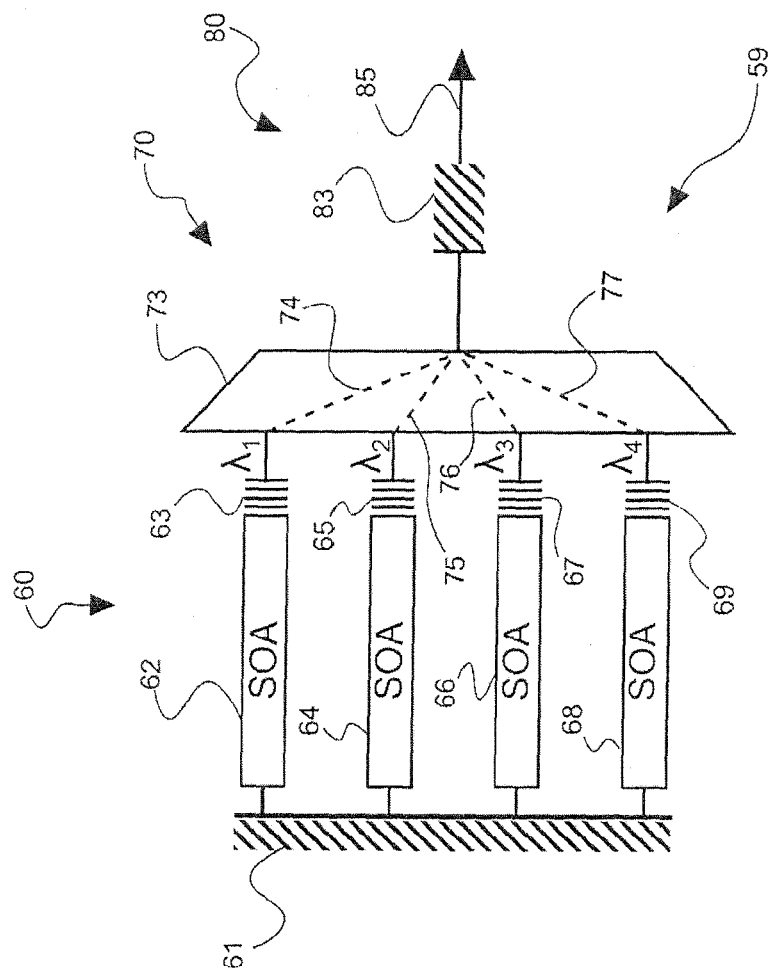
FIG. 8 illustrates an embodiment of the invention based on multiple laser cavities in the first or output resonator section.

So far we have only described the situation where there is one laser cavity coupled to a filter with multiple filtered feedback channels. However, there is also a situation where there are multiple laser cavities coupled to a single feedback channel, creating a multiwavelength laser. This is shown in FIG. 8, which illustrates a multi-wavelength laser 59 based on the concept of filtered feedback, in accordance with the invention. The laser 59 comprises a first or output resonator section 60, a tunable filter section 70, and a feedback section 80. In this configuration, a number of FP-lasers, comprised of mirror 61, semiconductor optical amplifiers 62, 64, 66, and 68, and distributed Bragg reflectors 63, 65, 67, and 69, are coupled to a single filter device 73 in the form of an arrayed waveguide grating (AWG) 73. The Arrayed waveguide grating (AWG) 73 only passes one wavelength per laser through to a feedback mirror 83 in the feedback section 80, via optical paths 74, 75, 76 and 77 in the Arrayed waveguide grating (AWG) 73. The filtered feedback light then locks each laser in the output section 60 to a different wavelength ($\lambda_1, \lambda_2, \lambda_3, \lambda_4$). The output 85 of the laser 59 is located in the optical path behind feedback mirror 83 in this configuration. The laser light therefore passes through the filter section 70 one extra time compared to the filtered feedback tunable laser shown in FIG. 1, where the output light comes directly from the FP-laser. This extra pass suppresses undesired side-modes and noise further. However, as a trade-off, the mirror 83 must be partially transparent and partially reflective in order to enable light to reach output 85.

Figure 9:
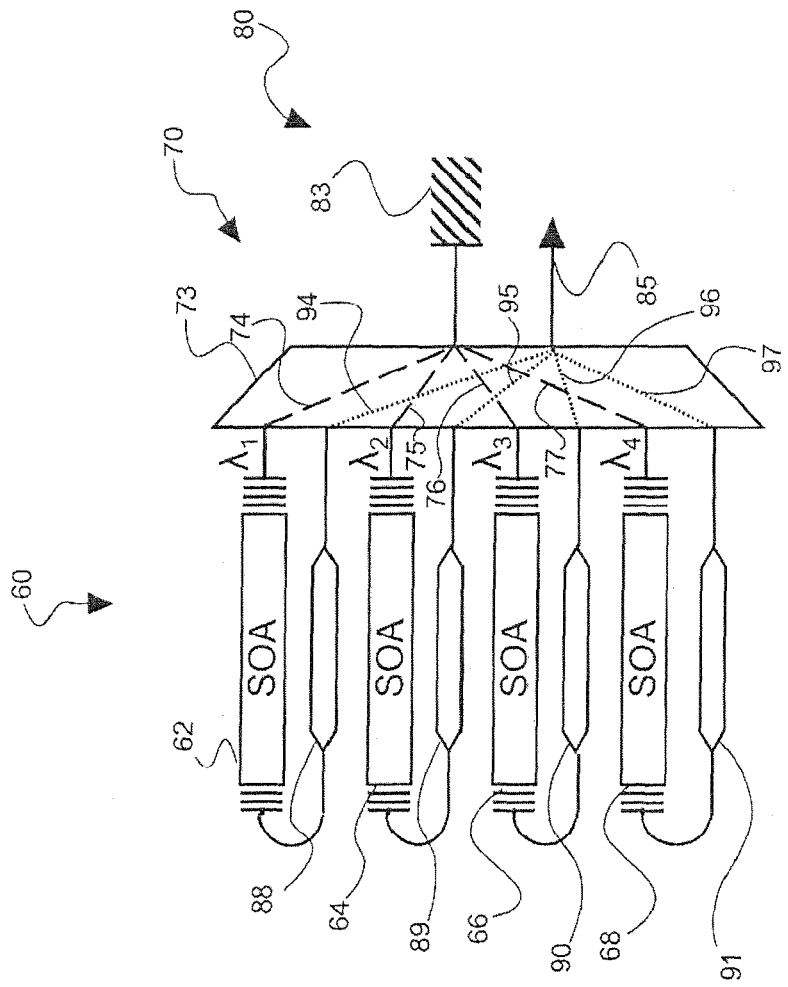
FIG. 9 shows an alternative embodiment to FIG. 8, wherein the optical output has been separated from the feedback section.

FIG. 9 discloses an improved embodiment, similar to the embodiment of FIG. 8, but different amongst others in the location of the output 85. Output 85 is now coupled to a different output of the Arrayed waveguide grating (AWG) 73, and may be reached from each of the FP-lasers in the first or output resonator section 60, through optical paths 94, 95, 96, and 97. In addition, feedback paths 74, 75, 76 and 77 of Arrayed waveguide grating (AWG) 73 only passes one wavelength per laser through to a feedback mirror 83 in the feedback section 80. Thus the output signal from the FP-lasers to output 85 is in Arrayed waveguide grating (AWG) 73 separated from the feedback signal from the FP-lasers to mirror 83. Mirror 83 may therefore be fully reflective, adding on to the efficiency of the feedback section 80, while the configuration of FIG. 9 still benefits from the additional pass through filter section 70 for suppressing undesired side-modes and noise.

In addition, in the configuration of FIG. 9 each of the FP-lasers in the output resonator section 60 comprises an optical modulator 88, 89, 90, and 91 between each of the SOA's 62, 64, 66, and 68 and the Arrayed waveguide grating (AWG) 73, for enabling wavelength dependent modulation of the output signal on output 85. These modulators are optional, as will be appreciated by the skilled person. The mirror 61 of FIG. 8, has been replaced by further Bragg reflectors at each of the semiconductor optical amplifiers 62, 64, 66, and 68 in FIG. 9.

Figure 10:
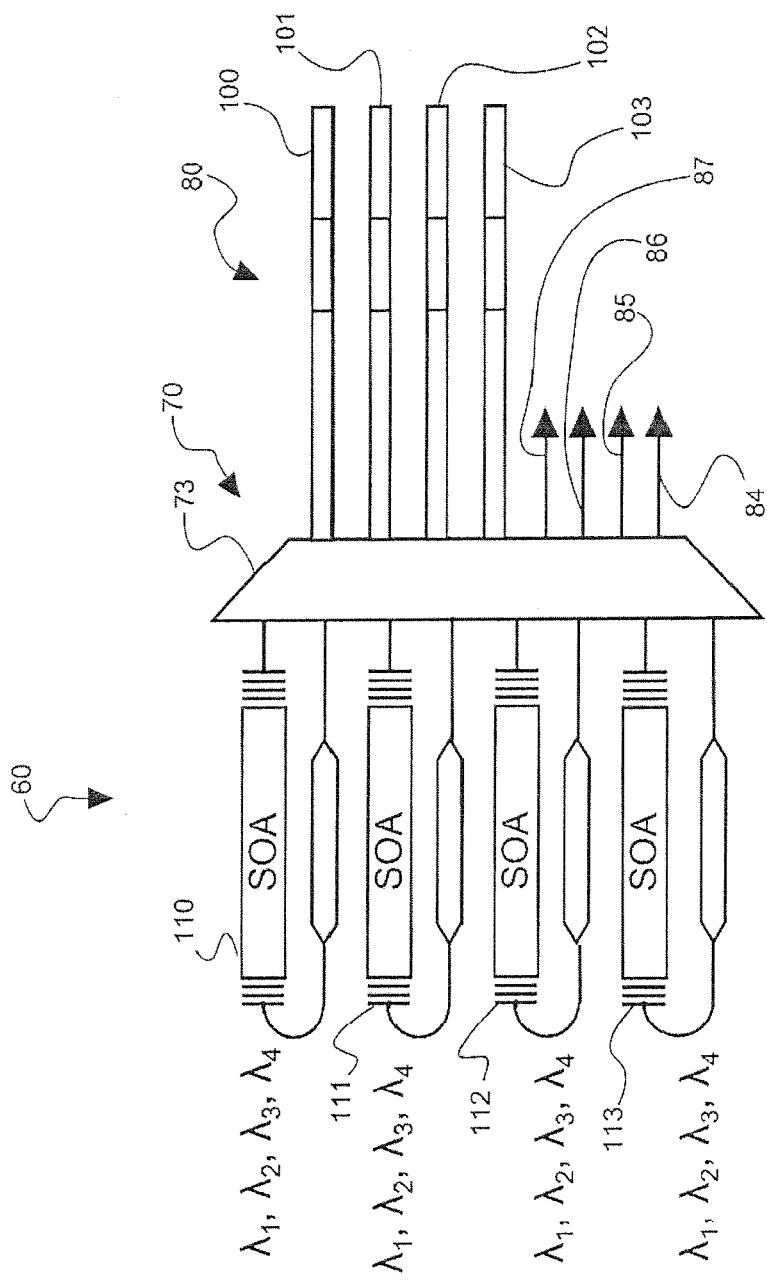
FIG. 10 shows an embodiment of the invention based on multiple laser cavities coupled to multiple feedback channels using the principle of filtered feedback.

Another embodiment of the invention is disclosed in FIG. 10. It illustrates a combination of the embodiments of FIGS. 1 and 9, combining the advantages of multiple feedback channels 100, 101, 102 and 103 with the advantages of multiwavelength lasers based on filtered feedback. The output resonator section 60 is identical to the embodiment of FIG. 9, and is not further described here, except for the fact that each FP-laser cavity in the output resonator section 60 has been assigned a reference number, i.e. reference numbers 110, 111, 112 and 113 respectively. The arrangement, in this embodiment, has four outputs 84, 85, 86 and 87, all separated from the feedback section 80. Optical paths from the FP-laser cavities 110-113 to either the outputs 84-87 or the feedback section 80, through Arrayed waveguide grating (AWG) 73, are not illustrated in FIG. 10 for reasons of clarity of the figure. Each output 84, 85, 86 and 87 may be coupled to one or more FP-laser cavity 110-113.

As an alternative to the embodiment of FIG. 10, each cavity 110-113 may comprise its own output, which may in that case be located at each cavity at the back-end thereof—which is the end furthest away from Arrayed waveguide grating (AWG) 73.

Arrayed waveguide grating (AWG) 73 is arranged for mapping each wavelength of each FP-laser cavity 110, 111, 112 and 113 to a single feedback channel 100, 101, 102, and 103 in the feedback section 80 (this is to say, although mapping of each wavelength of each cavity in the output section 60 takes place to a single channel in the feedback section 80, in an alternative embodiment, it is also possible to map each wavelength of each cavity 110-113 to at least one channel 100-103, or to map multiple wavelengths of each cavity 110-113 to at least one channel in the feedback section 60). However, the wavelengths of each cavity 110-113 mapped to a same channel 100-103 are different for each cavity, for example:

cavity 110 maps wavelength $\lambda_1$ to channel 100;
cavity 110 maps wavelength $\lambda_2$ to channel 101;
cavity 110 maps wavelength $\lambda_3$ to channel 102;
cavity 110 maps wavelength $\lambda_4$ to channel 103;
cavity 111 maps wavelength $\lambda_1$ to channel 103;
cavity 111 maps wavelength $\lambda_2$ to channel 100;
cavity 111 maps wavelength $\lambda_3$ to channel 101;
cavity 111 maps wavelength $\lambda_4$ to channel 102;
cavity 112 maps wavelength $\lambda_1$ to channel 102;
cavity 112 maps wavelength $\lambda_2$ to channel 103;
cavity 112 maps wavelength $\lambda_3$ to channel 100;
cavity 112 maps wavelength $\lambda$, to channel 101;
cavity 113 maps wavelength $\lambda_1$ to channel 101;
cavity 113 maps wavelength $\lambda_2$ to channel 102;
cavity 113 maps wavelength $\lambda_3$ to channel 103;
cavity 113 maps wavelength $\lambda_4$ to channel 100.

Therefore, channel 100 receives wavelength $\lambda_1$ of cavity 110, wavelength $\lambda_2$ of cavity 111, wavelength $\lambda_3$ of cavity 112, and wavelength $\lambda_4$ of cavity 113. Channel 101 receives wavelength $\lambda_2$ of cavity 110, wavelength $\lambda_3$ of cavity 111; wavelength $\lambda_4$ of cavity 112, and wavelength $\lambda_1$ of cavity 113. Channel 102 receives wavelength $\lambda_3$ of cavity 110, wavelength $\lambda_4$ of cavity 111, wavelength $\lambda_1$ of cavity 112, and wavelength $\lambda_2$ of cavity 113. Channel 103 receives wavelength $\lambda_4$ of cavity 110, wavelength $\lambda_1$ of cavity 111, wavelength $\lambda_2$ of cavity 112, and wavelength $\lambda$, of cavity 113.

In this embodiment, activating one of the feedback channels 100, 101, 102, 103, i.e. by activating a corresponding semiconductor optical amplifier, will lock each laser cavity 110, 111, 112, 113 in a different wavelength. This can be used for switching rapidly the wavelengths of all lasers by activating only a single gate in the feedback section 80.

It will be appreciated that the feedback channels illustrated in FIG. 10 are only illustrated schematically. Their layout and design may be chosen arbitrarily to suit the requirements of the specific application wherein the configuration is used. To achieve the abovementioned effect, it is necessary that each channel is ble to act as feedback channel for all its received wavelengths, i.e. $\lambda_1, \lambda_2, \lambda_3$, and $\lambda_4$.

In addition, in this configuration multiple laser cavities are coupled to multiple feedback channels, and the free spectral range (FSR) of the laser cavities 110-113 does not necessarily have to match the channel spacing on either side of Arrayed waveguide grating (AWG) 73. There might also be possibilities in using Vernier effects in the situation that the channel spacing is not the same on both sides of Arrayed waveguide grating (AWG) 73.

Applied Technology

The filtered feedback tunable laser of the present invention may be fabricated in InP based technology. In this technology it is possible to integrate both active and passive waveguides on a single chip. Active waveguides can provide optical amplification (used in the main laser cavity) and will absorb the light if no electrical current is provided (used in the feedback sections). Passive waveguides will guide the light with minimal loss (used in the Arrayed waveguide grating (AWG) and the other device connections). The InP-based layer structure is grown by Metal-Organic Chemical Vapor Deposition (MOCVD) and the properties of the materials can be adjusted to the needs of the feedback based tunable laser.

For creating the distributed Bragg reflector (DBR) gratings, the following is to be considered. Distributed Bragg reflector (DBR) gratings consist of a series of low-high refractive index transitions. Each transition causes a small reflection, but if the position of the transitions is chosen correctly, all reflections add up and a total reflection of more than 95% can be obtained. The low-high index transitions can be realized in different ways. In conventional DFB and (S)SG-DBR lasers, the transitions may be created by etching a small surface corrugation at the bottom or the top of the waveguide layer. The reflection per transition is determined by the etch depth, but is usually low and therefore long mirrors are required. The grating pattern can be defined by Electron Beam Lithography (EBL) or by Laser Interferometry Lithography (LIL), of which the latter is generally cheaper.

Another way of fabricating distributed Bragg reflector (DBR) mirrors is by alternatively narrowing and widening the waveguide, creating a corrugation on the side of the waveguide. The pattern has to be written by EBL or by advanced Deep-UV lithography. The advantage is that the grating depth is determined by the lithography pattern, which is easier to control than the etch depth. Also, there is no limitation on the size of the corrugation and in the extreme case the grating can cover the whole width of the waveguide. Theoretical and experimental studies have shown that these distributed Bragg reflector (DBR) mirrors can provide almost 100% reflectivity within a few micrometers.

Creation of distributed Bragg reflector (DBR) mirrors requires, amongst others, two important process steps. First, because the distributed Bragg reflector (DBR) mirrors contain sub-micron scale structures, the use of electron beam lithography is required. This may be achieved, amongst others, by a process that provides sufficient accuracy for the distributed Bragg reflector (DBR) mirrors and can be integrated with the current fabrication process of the active and passive waveguides.

Second, the distributed Bragg reflector (DBR) sections require a high quality etching process that provides waveguides with very smooth and very steep sidewalls. For the latter requirement, an Inductively Coupled Plasma (ICP) process is very suitable. This may be achieved with a process that uses an e-beam defined pattern as a mask for an ICP etching step. Alternatively, it may be achieved by use of deep-UV wafer-stepper, which is more cost effective for production of large series.

TABLE 1

| DWDM ITU-grid | | | | | | | | | | | |
|---|---|---|---|---|---|---|---|---|---|---|---|
| L-Band | | | | C-Band | | | | S-Band | | | |
| 100 GHz Grid | | 50 GHz Offset | | 100 GHz Grid | | 50 GHz Offset | | 100 GHz Grid | | 50 GHz Offset | |
| THz | nm | THz | nm | THz | nm | THz | nm | THz | nm | THz | nm |
| 186.00 | 1611.79 | 186.05 | 1611.35 | 191.00 | 1569.59 | 191.05 | 1569.18 | 196.00 | 1529.55 | 196.05 | 1529.16 |
| 186.10 | 1610.92 | 186.15 | 1610.49 | 191.10 | 1568.77 | 191.15 | 1568.36 | 196.10 | 1528.77 | 196.15 | 1528.38 |
| 186.20 | 1610.06 | 186.25 | 1609.62 | 191.20 | 1567.95 | 191.25 | 1567.54 | 196.20 | 1527.99 | 196.25 | 1527.60 |
| 186.30 | 1609.19 | 186.35 | 1608.76 | 191.30 | 1567.13 | 191.35 | 1566.72 | 196.30 | 1527.22 | 196.35 | 1526.83 |
| 186.40 | 1608.33 | 186.45 | 1607.90 | 191.40 | 1566.31 | 191.45 | 1565.90 | 196.40 | 1526.44 | 196.45 | 1526.05 |
| 186.50 | 1607.47 | 186.55 | 1607.04 | 191.50 | 1565.50 | 191.55 | 1565.09 | 196.50 | 1525.66 | 196.55 | 1525.27 |
| 186.60 | 1606.60 | 186.65 | 1606.17 | 191.60 | 1564.68 | 191.65 | 1564.27 | 196.60 | 1524.89 | 196.65 | 1524.50 |
| 186.70 | 1605.74 | 186.75 | 1605.31 | 191.70 | 1563.86 | 191.75 | 1563.45 | 196.70 | 1524.11 | 196.75 | 1523.72 |
| 186.80 | 1604.88 | 186.85 | 1604.46 | 191.80 | 1563.05 | 191.85 | 1562.64 | 196.80 | 1523.34 | 196.85 | 1522.95 |
| 186.90 | 1604.03 | 186.95 | 1603.60 | 191.90 | 1562.23 | 191.95 | 1561.83 | 196.90 | 1522.56 | 196.95 | 1522.18 |
| 187.00 | 1603.17 | 187.05 | 1602.74 | 192.00 | 1561.42 | 192.05 | 1561.01 | 197.00 | 1521.79 | 197.05 | 1521.40 |
| 187.10 | 1602.31 | 187.15 | 1601.88 | 192.10 | 1560.61 | 192.15 | 1560.20 | 197.10 | 1521.02 | 197.15 | 1520.63 |
| 187.20 | 1601.46 | 187.25 | 1601.03 | 192.20 | 1559.79 | 192.25 | 1559.39 | 197.20 | 1520.25 | 197.25 | 1519.86 |
| 187.30 | 1600.60 | 187.35 | 1600.17 | 192.30 | 1558.98 | 192.35 | 1558.58 | 197.30 | 1519.48 | 197.35 | 1519.09 |
| 187.40 | 1599.75 | 187.45 | 1599.32 | 192.40 | 1558.17 | 192.45 | 1557.77 | 197.40 | 1518.71 | 197.45 | 1518.32 |
| 187.50 | 1598.89 | 187.55 | 1598.47 | 192.50 | 1557.36 | 192.55 | 1556.96 | 197.50 | 1517.94 | 197.55 | 1517.55 |
| 187.60 | 1598.04 | 187.65 | 1597.62 | 192.60 | 1556.55 | 192.65 | 1556.15 | 197.60 | 1517.17 | 197.65 | 1516.78 |
| 187.70 | 1597.19 | 187.75 | 1596.76 | 192.70 | 1555.75 | 192.75 | 1555.34 | 197.70 | 1516.40 | 197.75 | 1516.02 |
| 187.80 | 1596.34 | 187.85 | 1595.91 | 192.80 | 1554.94 | 192.85 | 1554.54 | 197.80 | 1515.63 | 197.85 | 1515.25 |
| 187.90 | 1595.49 | 187.95 | 1595.06 | 192.90 | 1554.13 | 192.95 | 1553.73 | 197.90 | 1514.87 | 197.95 | 1514.49 |
| 188.00 | 1594.64 | 188.05 | 1594.22 | 193.00 | 1553.33 | 193.05 | 1552.93 | 198.00 | 1514.10 | 198.05 | 1513.72 |
| 188.10 | 1593.79 | 188.15 | 1593.37 | 193.10 | 1552.52 | 193.15 | 1552.12 | 198.10 | 1513.34 | 198.15 | 1512.96 |
| 188.20 | 1592.95 | 188.25 | 1592.52 | 193.20 | 1551.72 | 193.25 | 1551.32 | 198.20 | 1512.58 | 198.25 | 1512.19 |
| 188.30 | 1592.10 | 188.35 | 1591.68 | 193.30 | 1550.92 | 193.35 | 1550.52 | 198.30 | 1511.81 | 198.35 | 1511.43 |
| 188.40 | 1591.26 | 188.45 | 1590.83 | 193.40 | 1550.12 | 193.45 | 1549.72 | 198.40 | 1511.05 | 198.45 | 1510.67 |
| 188.50 | 1590.41 | 188.55 | 1589.99 | 193.50 | 1549.32 | 193.55 | 1548.91 | 198.50 | 1510.29 | 198.55 | 1509.91 |
| 188.60 | 1589.57 | 188.65 | 1589.15 | 193.60 | 1548.51 | 193.65 | 1548.11 | 198.60 | 1509.53 | 198.65 | 1509.15 |
| 188.70 | 1588.73 | 188.75 | 1588.30 | 193.70 | 1547.72 | 193.75 | 1547.32 | 198.70 | 1508.77 | 198.75 | 1508.39 |
| 188.80 | 1587.88 | 188.85 | 1587.46 | 193.80 | 1546.92 | 193.85 | 1546.52 | 198.80 | 1508.01 | 198.85 | 1507.63 |
| 188.90 | 1587.04 | 188.95 | 1586.62 | 193.90 | 1546.12 | 193.95 | 1545.72 | 198.90 | 1507.25 | 198.95 | 1506.87 |
| 189.00 | 1586.20 | 189.05 | 1585.78 | 194.00 | 1545.32 | 194.05 | 1544.92 | 199.00 | 1506.49 | 199.05 | 1506.12 |
| 189.10 | 1585.36 | 189.15 | 1584.95 | 194.10 | 1544.53 | 194.15 | 1544.13 | 199.10 | 1505.74 | 199.15 | 1505.36 |
| 189.20 | 1584.53 | 189.25 | 1584.11 | 194.20 | 1543.73 | 194.25 | 1543.33 | 199.20 | 1504.98 | 199.25 | 1504.60 |
| 189.30 | 1583.69 | 189.35 | 1583.27 | 194.30 | 1542.94 | 194.35 | 1542.54 | 199.30 | 1504.23 | 199.35 | 1503.85 |
| 189.40 | 1582.85 | 189.45 | 1582.44 | 194.40 | 1542.14 | 194.45 | 1541.75 | 199.40 | 1503.47 | 199.45 | 1503.10 |
| 189.50 | 1582.02 | 189.55 | 1581.60 | 194.50 | 1541.35 | 194.55 | 1540.95 | 199.50 | 1502.72 | 199.55 | 1502.34 |
| 189.60 | 1581.18 | 189.65 | 1580.77 | 194.60 | 1540.56 | 194.65 | 1540.16 | 199.60 | 1501.97 | 199.65 | 1501.59 |
| 189.70 | 1580.35 | 189.75 | 1579.93 | 194.70 | 1539.77 | 194.75 | 1539.37 | 199.70 | 1501.21 | 199.75 | 1500.84 |
| 189.80 | 1579.52 | 189.85 | 1579.10 | 194.80 | 1538.98 | 194.85 | 1538.58 | 199.80 | 1500.46 | 199.85 | 1500.09 |
| 189.90 | 1578.69 | 189.95 | 1578.27 | 194.90 | 1538.19 | 194.95 | 1537.79 | 199.90 | 1499.71 | 199.95 | 1499.34 |

TABLE 1-continued

| DWDM ITU-grid | | | | | | | | | | | |
|---|---|---|---|---|---|---|---|---|---|---|---|
| L-Band | | | | C-Band | | | | S-Band | | | |
| 100 GHz Grid | | 50 GHz Offset | | 100 GHz Grid | | 50 GHz Offset | | 100 GHz Grid | | 50 GHz Offset | |
| THz | nm | THz | nm | THz | nm | THz | nm | THz | nm | THz | nm |
| 190.00 | 1577.86 | 190.05 | 1577.44 | 195.00 | 1537.40 | 195.05 | 1537.00 | 200.00 | 1498.96 | 200.05 | 1498.59 |
| 190.10 | 1577.03 | 190.15 | 1576.61 | 195.10 | 1536.61 | 195.15 | 1536.22 | 200.10 | 1498.21 | 200.15 | 1497.84 |
| 190.20 | 1576.20 | 190.25 | 1575.78 | 195.20 | 1535.82 | 195.25 | 1535.43 | 200.20 | 1497.46 | 200.25 | 1497.09 |
| 190.30 | 1575.37 | 190.35 | 1574.95 | 195.30 | 1535.04 | 195.35 | 1534.64 | 200.30 | 1496.72 | 200.35 | 1496.34 |
| 190.40 | 1574.54 | 190.45 | 1574.13 | 195.40 | 1534.25 | 195.45 | 1533.86 | 200.40 | 1495.97 | 200.45 | 1495.60 |
| 190.50 | 1573.71 | 190.55 | 1573.30 | 195.50 | 1533.47 | 195.55 | 1533.07 | 200.50 | 1495.22 | 200.55 | 1494.85 |
| 190.60 | 1572.89 | 190.65 | 1572.48 | 195.60 | 1532.68 | 195.65 | 1532.29 | 200.60 | 1494.48 | 200.65 | 1494.11 |
| 190.70 | 1572.06 | 190.75 | 1571.65 | 195.70 | 1531.90 | 195.75 | 1531.51 | 200.70 | 1493.73 | 200.75 | 1493.36 |
| 190.80 | 1571.24 | 190.85 | 1570.83 | 195.80 | 1531.12 | 195.85 | 1530.72 | 200.80 | 1492.99 | 200.85 | 1492.62 |
| 190.90 | 1570.42 | 190.95 | 1570.01 | 195.90 | 1530.33 | 195.95 | 1529.94 | 200.90 | 1492.25 | 200.95 | 1491.88 |

List of Abbreviations and Acronyms

| AWG | Arrayed Waveguide Grating |
|---|---|
| DBR | Distributed Bragg Reflector |
| DDE | Delayed Differential Equations |
| DFB | Distributed FeedBack |
| DSDBR | Digital-Supermode Distributed Bragg Reflectors |
| EBL | Electron Beam Lithography |
| FOF | Filtered Optical Feedback |
| FTTH | Fiber To The Home |
| FTTP | Fiber To The Premises |
| FP | Fabry-Perot |
| ICP | Inductively Coupled Plasma |
| IFF-TL | Integrated Filtered-Feedback Tunable Laser |
| InP | Indium Phosphide |
| ITU | International Telecommunication Union |
| LFF | Low Frequency Fluctuations |
| LIL | Laser Interferometry Lithography |
| MEMS | Micro Electro-Mechanical Systems |
| MOCVD | Metal Organic Chemical Vapor Deposition |
| OED | Opto-Electronic Devices |
| PIC | Photonic Integrated Circuit |
| PON | Passive Optical Networks |
| SGDBR | Sampled Grating Distributed Bragg Reflectors |
| SG-TTG | Sampled-Grating-Tunable-Twin-Guide |
| SOA | Semiconductor Optical Amplifier |
| SSGDBR | Super-Structure-Grating Distributed Bragg Reflectors |
| VCSEL | Vertical Cavity Surface Emitting Laser |
| WDM | Wavelength Division Multiplexing |

The invention claimed is:

1. Semiconductor laser device comprising a first resonator for resonating an optical resonator signal for providing an optical output signal at an output of said laser device, wherein said first resonator is arranged for selectively resonating at a plurality of discrete output wavelengths, and wherein said laser device further comprises a plurality of second resonators operatively connected to said first resonator, said plurality of second resonators being arranged for providing an optical feedback signal at a feedback wavelength to said first resonator for locking said first resonator into resonating at a selected output wavelength of said discrete output wavelengths, which selected output wavelength corresponds to said feedback wavelength for providing said optical output signal; wherein said plurality of second resonators is arranged for providing said optical feedback signal selectable at a plurality of feedback wavelengths; wherein said plurality of second resonators comprises a plurality of resonant cavities, wherein each of said resonant cavities is arranged for resonating at a cavity wavelength corresponding to at least one of said plurality of feedback wavelengths, said device further comprising means for selecting one of said plurality of resonant cavities for providing said optical feedback signal.

2. Semiconductor laser device according to claim 1, wherein said means for selecting one of said resonant cavities comprises means for selectively powering a semiconductor optical amplifier of each of said resonant cavities.

3. Semiconductor laser device according to claim 1, wherein said plurality of second resonators comprises at least one tunable cavity of said resonant cavities, which tunable cavity is arranged for selectively resonating at one of a plurality of discrete cavity wavelengths, wherein each cavity wavelength of said plurality of discrete cavity wavelengths corresponds to one of said feedback wavelengths.

4. Semiconductor laser device according to claim 3, wherein said at least one tunable cavity comprises a tunable grating for selectively resonating at one of said plurality of discrete cavity wavelengths.

5. Semiconductor laser device according to claim 4, wherein said tunable grating is a tunable sampled grating or a tunable vertical groove grating.

6. Semiconductor laser device according to claim 1, further comprising an tunable filter element for providing said operative connection between said plurality of second resonators and said first resonator, wherein said tunable filter element is arranged for selectively transmitting at least one of said feedback wavelengths.

7. Semiconductor laser device according to claim 6, wherein said tunable filter element comprises an arrayed waveguide grating.

8. Semiconductor laser device according to claim 1, further comprising means for controlling a phase of said optical feedback signal.

9. Semiconductor laser device according to claim 1, wherein said first resonator comprises one or more output resonant cavities, wherein each of said one or more output resonant cavities is arranged for resonating at one or more of said plurality of discrete output wavelengths for providing said optical output signal.

10. Semiconductor laser device according to claim 9, wherein said first resonator comprises a single output cavity arranged for resonating at all of said plurality of discrete output wavelengths for providing said optical output signal, or wherein said first resonator comprises multiple output resonant cavities, wherein each output cavity of said multiple output resonant cavities is arranged for resonating at one or more of said plurality of discrete output wavelengths for providing said optical output signal.

11. Semiconductor laser device according to claim 10, wherein said first resonator comprises said multiple output resonant cavities, and wherein a tunable filter element is arranged for selectively per output cavity transmitting one or more of said feedback wavelengths between each of said output resonant cavities and said plurality of second resonators.

12. Semiconductor laser device according to claim 11, further comprising means for combining output cavity signals from one or more of said output resonant cavities for providing said optical output signal.

13. Semiconductor laser device according to claim 1, wherein said discrete output wavelengths are within a range between 1400 nm and 1700 nm, or wherein said discrete output wavelengths correspond to wavelengths defined in dense wavelength division multiplexing (DWDM) international telecommunications union (ITU) grid specification (ITU-grid) wavelengths.

14. Semiconductor laser device according to claim 1, wherein said first resonator comprises a Fabry-Perot resonator, or wherein said first resonator comprises Bragg reflection mirrors for resonating at said plurality of discrete output wavelengths.

\* \* \* \* \*